(12) United States Patent
Gambino et al.

(10) Patent No.: US 6,177,348 B1
(45) Date of Patent: Jan. 23, 2001

(54) LOW TEMPERATURE VIA FILL USING LIQUID PHASE TRANSPORT

(75) Inventors: Jeffrey P. Gambino, Gaylordsville, CT (US); Peter D. Hoh, Hopewell Junction, NY (US); Mark A. Jaso, Manassas, VA (US); Ernest N. Levine, Poughkeepsie, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/009,446

(22) Filed: Jan. 20, 1998

(51) Int. Cl.[7] ................................................. H01L 21/44
(52) U.S. Cl. ........................... 438/677; 438/660; 438/926
(58) Field of Search .................................... 438/660, 677, 438/926

(56) References Cited

U.S. PATENT DOCUMENTS 5,308,794 * 5/1994 Tu ........................................ 437/194
5,843,842 * 12/1998 Lee ...................................... 438/688

* cited by examiner

Primary Examiner—Charles Bowers
Assistant Examiner—Nema Berezny
(74) Attorney, Agent, or Firm—Tiffany L. Townsend

(57) ABSTRACT

A method for depositing materials on a surface, having the following steps: a) obtaining a surface having at least feature thereon, the surface and the feature having a layer of first material deposited thereon, the first material not filling substantially all of the feature; b) depositing a layer of a second material on the first material, wherein the melting point of the second material is less than that of the first material, and wherein the first material is soluble in the second material at a temperature less than the melting point of the first material; and c) heating the surface to a first temperature of at least equal to the melting point of the second material and at most equal to the melting point of the first material, wherein substantially all of the via is filled with the first material.

24 Claims, 7 Drawing Sheets

LOW TEMPERATURE VIA FILL USING LIQUID PHASE TRANSPORT

FIELD OF THE INVENTION

This invention is directed toward semiconductor device manufacturing in general, and more specifically to structures and methods of filling vias such that the vias are substantially free of non-conformities.

BACKGROUND

Advanced integrated circuit technology continues to create new challenges as components and architecture are reduced in size. Communication between different levels deposited on a substrate has become more complex since the size of the features, typically vias, connecting the different levels has changed in size and shape, especially the aspect ratio. By via it is meant an area created by either etching away a portion of a layer so that a 'hole' is created or an area created by the deposition of raised portions that define the walls of the area. For the remainder of the discussion, a feature will be referred to as a via.

The aspect ratio of a via is a measure of the height (H) compared to the width (W). If a via is wide and shallow, the aspect ratio is less than 1, H/W<1. If a via is narrow and deep then the aspect ratio will be greater than 1, H/W>1.

After a via is created it usually is filled with a material. Filling a via with an H/W<1 is well understood in the art and can be efficiently done with known techniques. However, filling a via with an H/W>1 still presents a challenge. As shown in FIG. 1, when the aspect ratio is greater than 1, the via, 1, has the shape of a rectangle with the length of the bottom of the rectangle (W), 2, at most equal to the length of the sidewalls (H), 3. Current via filling techniques must be followed with precision to fill vias with an aspect ratio approaching 1. There is little margin for error when filling high aspect ratio vias where the ratio is greater than 1. As the value of H/W increases even the most precise methods might not produce reliably filled vias. As shown in FIG. 2, the shape of void portion, 5, of a via, 1, may, for example, be tear-shaped. The two side portions covering the walls of the via, 5a and 5b, may, for example, be in the shape of the tear, where one side of the void area, 5, is open at the surface, 5c. The two side portion covering the walls of the via, 5a and 5b, may or may not be perpendicular to the bottom of the via and also may or may not be in contact with each other. When the tops of the two side portions, 5a and 5b are in contact with each other "pinchoff" is said to have occurred.

Current methods of filling high aspect ratio vias involve deposition techniques like high temperature sputtering, chemical vapor deposition (CVD) and forceful. Most, if not all, of these techniques fill vias in such a way that it is requires either a high temperature or expensive methods.

SUMMARY OF THE INVENTION

It is therefore an object of the present invention to provide a low temperature method of filling voids.

It is also an object of the present invention to provide a method of reliably filling high aspect ratio features.

It is a further object of the present invention to provide a low temperature method of filling voids in vias where a sacrificial layer of a second metal is deposited.

In accordance with the above listed and other objects, we disclose and claim a method for depositing materials on a surface, comprising:

a) obtaining a surface having at least feature thereon, the surface and the feature having a layer of first material deposited thereon, the first material not filling substantially all of the feature;

b) depositing a layer of a second material on the first material, wherein the melting point of the second material is less than that of the first material, and wherein the first material is soluble in the second material at a temperature less than the melting point of the first material;

c) heating the surface to a first temperature of at least equal to the melting point of the second material and at most equal to the melting point of the first material, wherein substantially all of the feature is filled with the first material.

BRIEF DESCRIPTION OF THE DRAWINGS

These and other features, aspects, and advantages will be more readily apparent and better understood from the following detailed description of the invention, in which.

DETAILED DESCRIPTION

Liquid phase transport involves the use of fluids that are capable of movement. In the present invention, a material in its liquid phase is deposited on a surface having a feature. The liquid is generally capable of occupying any space that is not filled with solid matter. A fluid in a liquid phase is usually in a temperature range between the fluid's melting point and boiling point. If the fluid is a mixture of two or more components then as temperature of the fluid decreases toward the melting point of the fluid, precipitates of one of the components, or combinations of the components, may form.

In the instant invention, a second material in its liquid state is deposited on a structure having a feature, in this example the structure comprises a via, that is not substantially filled by a previously deposited layer of a first material. By substantially filled it is meant that the via is substantially free of voids, holes and non-conformities in the first material that could negatively impact the resulting structure's physical and electrical capabilities. The second material fills any holes or voids on the surface having the previously deposited layer first material. Over time a portion of the first material could diffuse into the second material. For example, at an equilibrium state a certain maximum percentage of the first material will diffuse into the second material. The percentage will be determined by a number of factors including pressure, temperature, composition of the first and second materials and surface area. As the second material cools, precipitates of the first material may form. The precipitates can then fill the voids, holes or nonconformities such that the resulting via is substantially filled with the first material.

Figure 1:
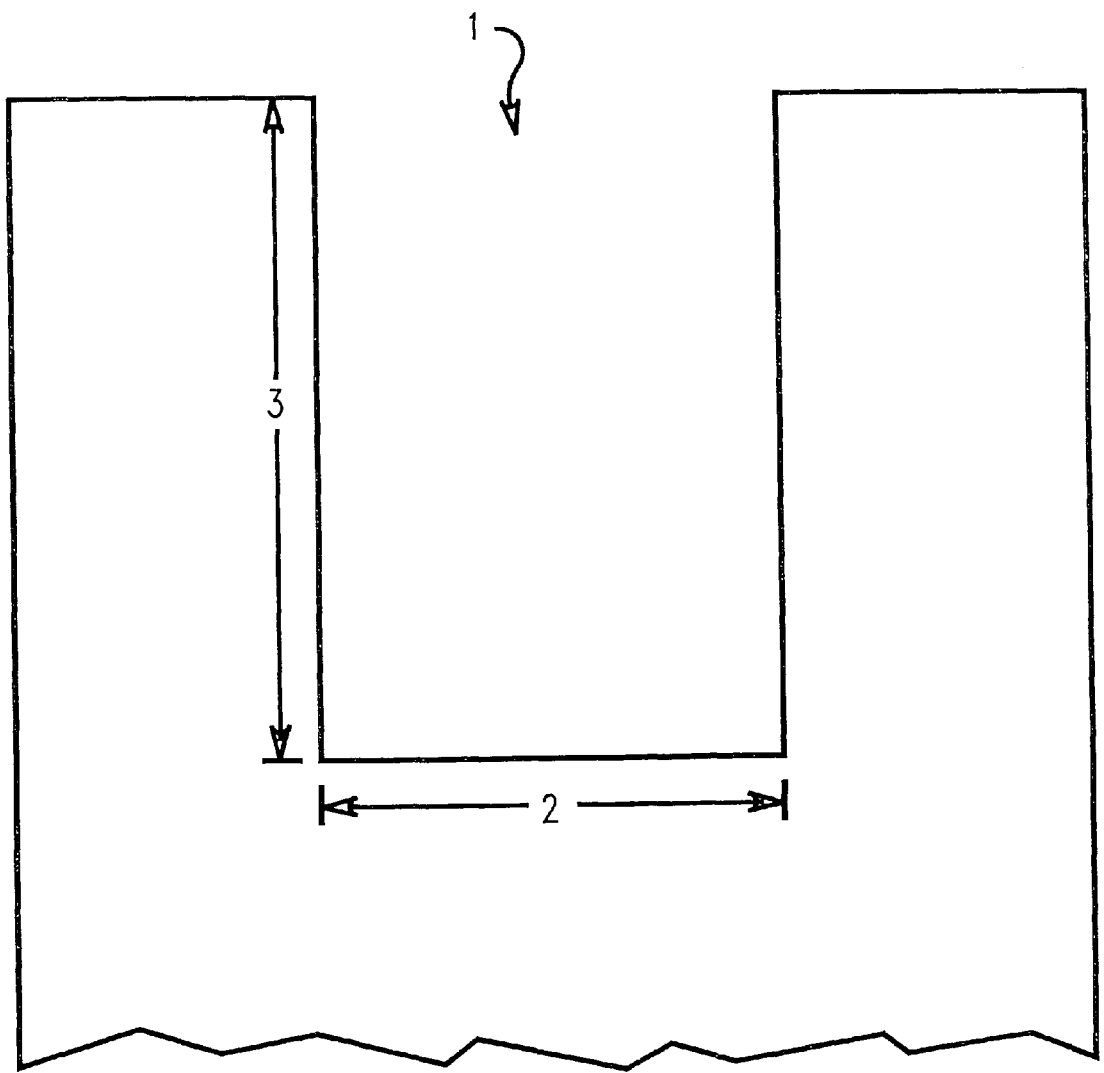
FIG. 1 is a cross-sectional view of high aspect ratio via structure.
Figure 2:
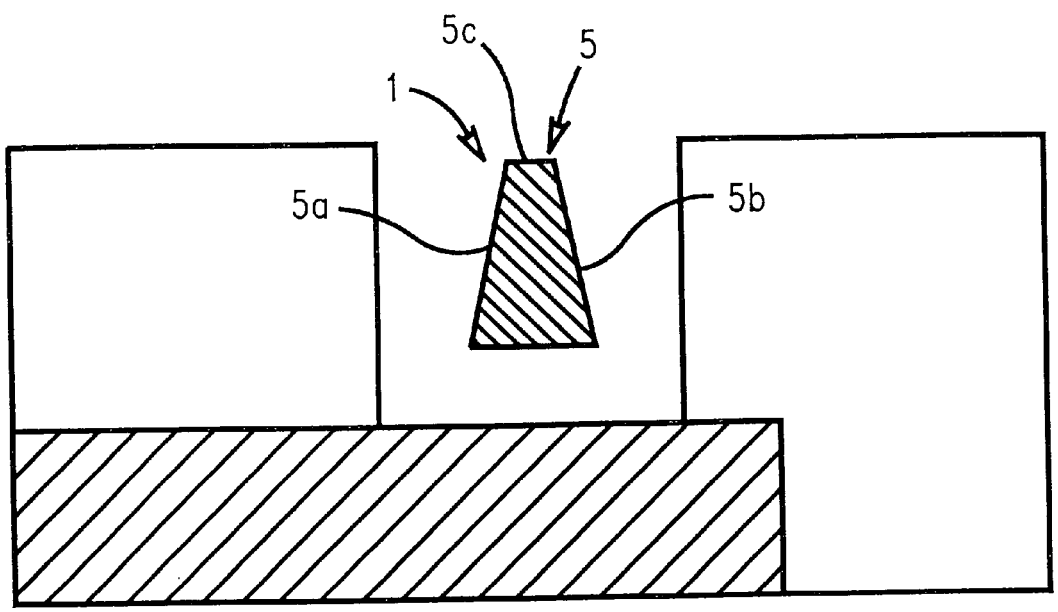
FIG. 2 is a cross-sectional view of a partially filled high aspect ratio via.
Figure 3A:
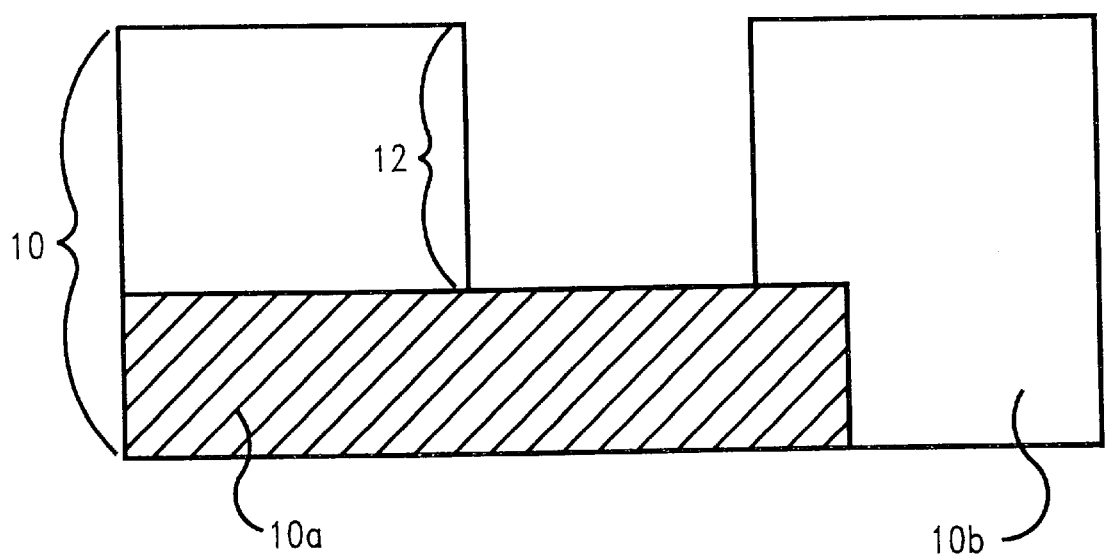
FIGS. 3a–3e are cross-sectional views of the structure as it undergoes the steps of the process of the instant invention.

An example of the method of the instant invention is shown in FIGS. 3a–3e. As shown in FIG. 3a, a first layer, 10, is deposited on a surface (not shown). The first layer, 10, is patterned by any means known in the art, such that a via, 12, is formed. In the instant invention, it is not necessary that all portions of the first layer, 10, be composed of the same material. For example, the first layer 10, could be formed of different materials which occupy portions of the first layer.

One possible configuration of the first layer is shown in FIG. 3a as 10a and 10b. It is also contemplated that the first layer may comprise more than one deposition step.

Figure 3B:
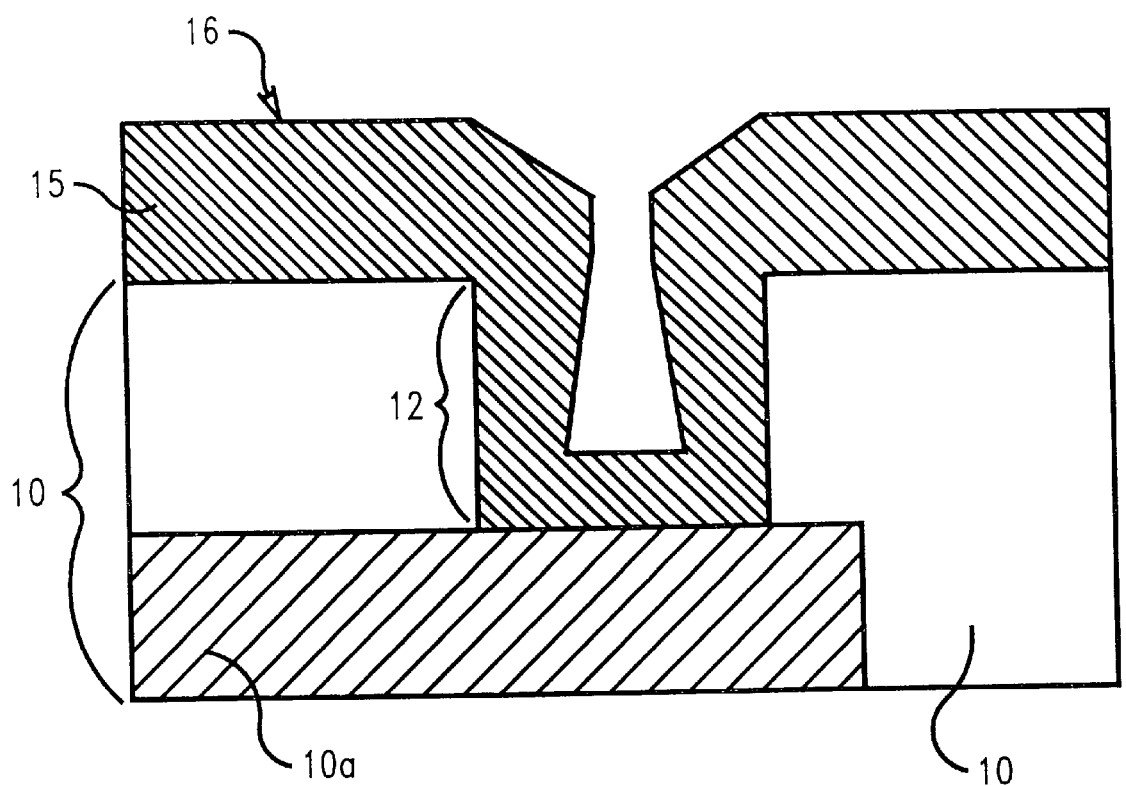

In FIG. 3b, a layer of a second material (M2), 15, is then deposited on the first layer, 10, by any means known in the art. During the deposition of the second layer, 15, less than substantially all of the via, 12, formed in the first layer, 10, would be filled. If most points on the surface, 16, of the second layer would not be along a parallel plane, it would be an indication that less than substantially all of the via is filled. However, it is possible to have a void that leaves most of the points on the surface, 16, of the second layer on parallel planes.

A third layer (M3), 20, is deposited on the second layer, 15. The third layer, 20, may be comprised of a low melting point material. By low melting point it is meant that the melting point of the material deposited as the third layer be lower than the melting point of the material deposited as the second layer. If the diffusion of M2 into the M3 is desired then the formula for the thickness of the third deposited layer is $$t_{liq} = t_{m2}/((atm\ \%\ m2)/100)$$

where $t_{liq}$ is thickness of the low melting point material, $t_{m2}$ is the thickness of the second layer deposited that will be dissolved, and atm % m2 is the percent of material in the second layer that will dissolve in the low melting point material at a predetermined temperature.

Alternatively, the M3 deposited as the third layer, 20, may be comprised of an alloy containing amounts of M2. In the instances where M2 is present in the M3 alloy in sufficient quantities, the formula for $t_{liq}$ is still valid but it is not necessary to determine the atm % m2 because the diffusion of M2 into M3 is no longer a significant factor.

Figure 3C:
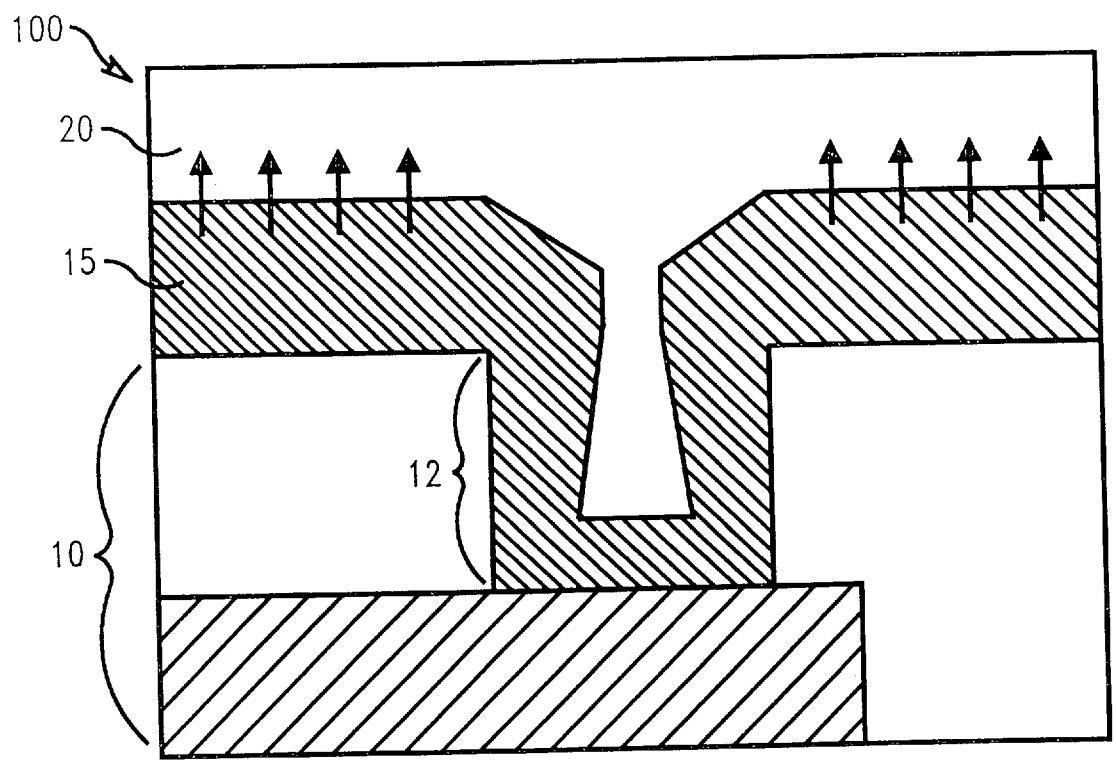
Figure 3D:
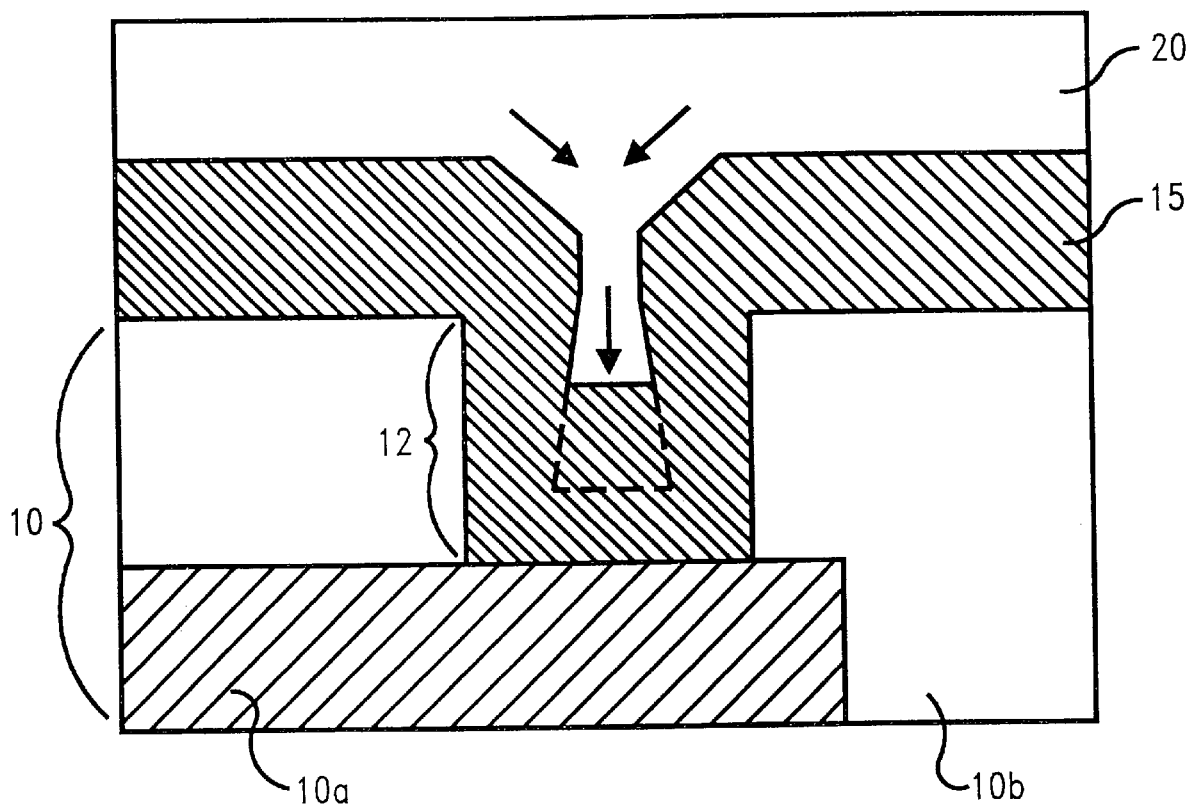

After depositing the third layer, 20, the structure is heated to a temperature between the melting point of M3 and the melting point of M2, the annealing temperature. As shown in FIG. 3c, M2, diffuses into M3, 20, if necessary. The structure, 100, is held at the annealing temperature for a minimum period of time. The minimum amount of time that the structure is held at the annealing temperature is dependent on the percent dissolution of M2 into M3 at the annealing temperature that is desired by the operator and the composition of M3. In a preferred embodiment, the temperature would be held at the annealing temperature for at least a period of time sufficient to ensure that the maximum saturation of M2 in M3 at the annealing temperature is achieved called the minimal time. When the temperature of the structure is held at the annealing temperature for a period of time greater than the minimal time, the M2, 15, will precipitate out of M3, 20, as shown in FIG. 3d.

Figure 3E:
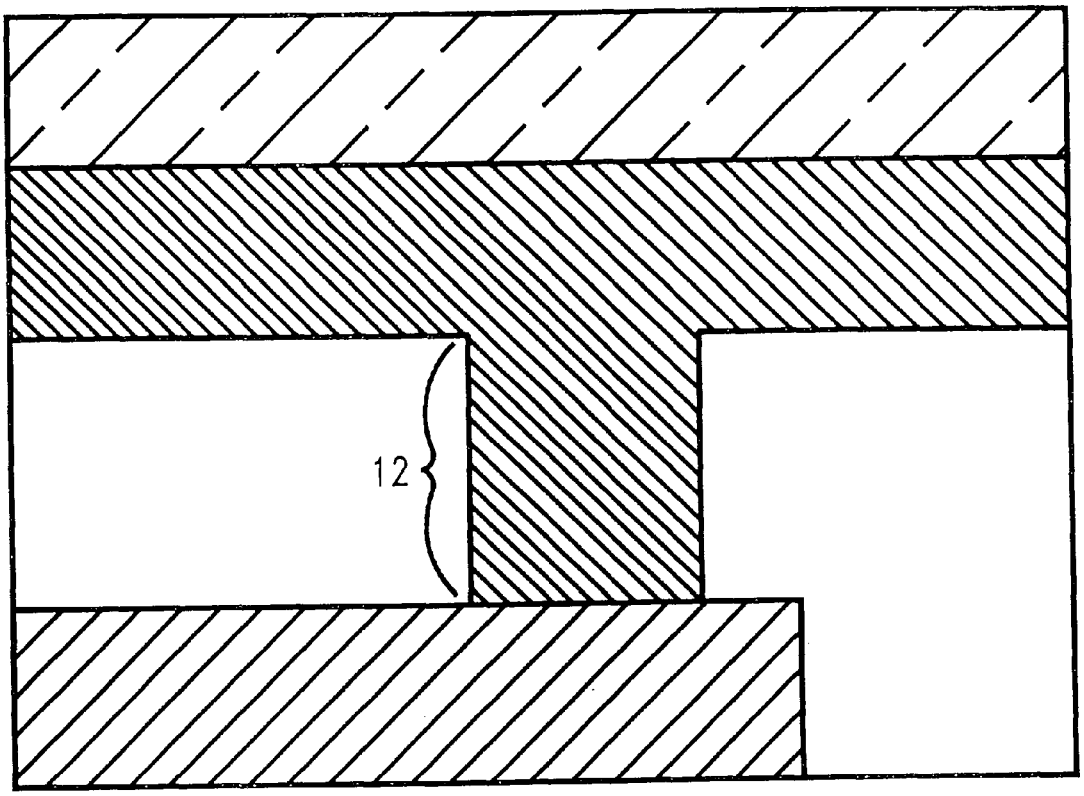

There are at least two different cooling methods which facilitate the filling of the void in M2. The first method involves maintaining the annealing temperature for a period of time sufficient to fill the voided area. The length of time would be influenced by a number of factors, including the size and shape of the void. A second method involves the cooling of the structure to a second temperature, the precipitation anneal temperature. The precipitation anneal temperature should be at most equal to the annealing temperature and at least equal to the melting point of M3. In this second cooling method, the lower precipitation anneal temperature will facilitate the precipitation of M2 since, as a general rule, less of M2 can remain dissolved in M3 at the second, lower, temperature. The structure is kept at the second temperature for a period of time sufficient to fill the void area. As shown in FIG. 3e, substantially all of the via, 12, is filled by the end of the cooling step.

In a preferred embodiment, after the void is filled, the structure may be cooled even further and M3 is removed from the surface of the structure. Additionally, M2 could be removed from the surface of the structure, so that M2 is located in the feature only.

As an example, the method of the instant invention will be shown where M2 is aluminum. Examples of other materials that could comprise M2 include Al—Cu and Al—Cu—Si. In a preferred embodiment the aluminum layer would be at least 50 Å and at most 1000 Å thick and might be lined with a layer of a refractory metal like Ti or TiN which is 50 Å to 1000 Å thick. Typically, M2 would be thicker than the minimum operable thickness associated with the layer. The layer is usually thicker than the minimum operable thickness because a portion, not necessarily a significant portion, might be dissolved into the material comprising the third layer. Examples of materials that could comprise M3, if M2 were aluminum, include gallium, indium, tin and alloy containing aluminum and gallium, indium or tin. In this example and in a preferred embodiment M3 comprises gallium.

The melting point of gallium is ≈30° C. The gallium layer may be deposited by any means and temperature known in the art, but in a preferred embodiment the gallium is deposited using a collimated sputtering technique at a temperature of at least 0° C. and at most 400° C. In the present example the structure is then heated to an annealing temperature between the melting point of the gallium and the melting point of the aluminum. In a preferred embodiment the annealing temperature is about 300° C. and the temperature is held at that temperature for at least about 1 minute and at most about 300 minutes.

In a most preferred embodiment, a surface having a structure having a via is provided. A layer of Ti or TiN 200 Å thick is deposited, by collimated sputtering at 100° C., on the structure prior to the deposition of the aluminum containing M2 layer. A layer of aluminum, M2, 0.3 microns thick is then deposited by collimated sputtering at 100° C. Any void created during the deposition of the aluminum would not be pinched off, it would be substantially tear shaped. A layer of gallium 3300 Å thick is then deposited by collimated sputtering at 100° C. The structure is then heated to an annealing temperature of 300° C. and held at that temperature for 10 minutes. The structure is then cooled to a precipitation annealing temperature of 250° C. and held at that temperature for 10 minutes. The third layer comprising gallium would then be removed by any means known in the art.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

We claim:

1. A method for depositing materials on a semiconductor surface, comprising:

a) obtaining a semiconductor surface having at least via thereon, the surface and the via having a layer of first material deposited thereon, the first material not filling substantially all of the via;

b) depositing a layer of a second material on the first material, wherein the melting point of the second material is less than that of the first material, and wherein the first material is soluble in the second material at a temperature less than the melting point of the first material; and c) heating the surface to a first temperature of at least equal to the melting point of the second material and at most equal to the melting point of the first material, wherein substantially all of the via is filled with the first material.

2. The method according to claim 1 further comprising the step of removing the layer of the second material after the step of heating the surface.

3. The method according to claim 1 wherein the surface comprises a dielectric material.

4. The method according to claim 1 wherein the first material is a first metal.

5. The method according to claim 1 wherein the second material comprises a second metal.

6. The method according to claim 4 wherein the first metal is selected from the group consisting of aluminum and aluminum alloys.

7. The method according to claim 4 wherein the first material is aluminum.

8. The method according to claim 5 wherein the second metal is selected from the group consisting of gallium, indium, tin and alloys comprising aluminum and at least one of gallium, indium or tin.

9. The method according to claim 8 wherein the second metal is gallium.

10. The method according to claim 3 wherein the via is lined with a third material capable of improving the reliability of later deposited layers prior to the step of depositing the first material.

11. The method according to claim 10 wherein the third material is a refractory metal.

12. The method according to claim 11 wherein the refractory metal is selected from the group consisting of Ti and Ti/N.

13. The method according to claim 1 wherein the deposition of the second material occurs at a temperature of at least about 0° C. and at most about 400° C.

14. The method according to claim 1 wherein the heating is an annealing and the first temperature is about 300° C.

15. The method according to claim 1 further comprising the step of cooling the surface to a second temperature after the step of heating the surface to a first temperature, wherein the second temperature is above the melting point of the second material.

16. The method according to claim 15 wherein the second temperature is about 250° C.

17. The method according to claim 1 wherein the portion of the via not substantially filled by the first material is capable of receiving the second material.

18. The method according to claim 1 wherein the thickness of the second layer is about equal to the thickness of the first layer.

19. The method according to claim 1 wherein the first material dissolves in the second material and the thickness of the second material is determined by the following equation:

$$t_{m2} = t_{m1}/((atm~\%~m1)/100)$$

where $t_{m2}$ is thickness of the second material, $t_{m1}$ is the thickness of the first material deposited that will be dissolved, and atm % m1 is the percent of first material that will dissolve in the second material at a predetermined temperature.

20. The method according to claim 1 wherein the structure is held at the first temperature for at least about 1 minute and at most about 300 minutes.

21. The method according to claim 14 wherein the structure is held at the first temperature for at least about 1 minute and at most about 300 minutes.

22. The method according to claim 15 wherein the structure is held at the first temperature for at least about 1 minute and at most about 300 minutes and the structure is held at the second temperature for at least about 1 minute and at most about 300 minutes.

23. The method according to claim 22 wherein the structure is held at the first temperature for about 10 minutes and the structure is held at the second temperature for about 10 minutes.

24. A method for depositing materials on a semiconductor surface, comprising:

a) obtaining a semiconductor surface having at least one via thereon, the surface and the via having a layer of first material deposited thereon, the first material not filling substantially all of the via;

b) depositing a layer of a second material on the first material, wherein the melting point of the second material is less than that of the first material, and wherein the first material is capable of diffusing in the second material at a temperature less than the melting point of the first material; and c) heating the surface to a first temperature of at least equal to the melting point of the second material and at most equal to the melting point of the first material, wherein the first material diffuses into the second material and wherein substantially all of the via is filled with the first material.

* * * * *